(12) United States Patent
Shim et al.

(10) Patent No.: US 9,006,888 B2
(45) Date of Patent: Apr. 14, 2015

(54) SEMICONDUCTOR DEVICE AND METHOD OF FORMING STRESS RELIEF LAYER BETWEEN DIE AND INTERCONNECT STRUCTURE

(75) Inventors: Il Kwon Shim, Singapore (SG); Seng Guan Chow, Singapore (SG); Yaojian Lin, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 634 days.

(21) Appl. No.: 13/248,312

(22) Filed: Sep. 29, 2011

(65) Prior Publication Data

US 2012/0018882 A1   Jan. 26, 2012
US 2012/0223426 A9   Sep. 6, 2012

Related U.S. Application Data

(62) Division of application No. 12/481,404, filed on Jun. 9, 2009, now Pat. No. 8,039,303.

(60) Provisional application No. 61/060,778, filed on Jun. 11, 2008.

(51) Int. Cl.
*H01L 23/498* (2006.01)
*H01L 23/48* (2006.01)
(Continued)

(52) U.S. Cl.
CPC .......... *H01L 21/568* (2013.01); *H01L 21/6835* (2013.01); *H01L 23/3128* (2013.01); *H01L 23/5384* (2013.01); *H01L 23/5389* (2013.01); *H01L 24/97* (2013.01); *H01L 25/105* (2013.01); *H01L 24/19* (2013.01); *H01L 24/82* (2013.01); *H01L 23/66* (2013.01); *H01L 2221/68345* (2013.01); *H01L 2224/04105* (2013.01);

(Continued)

(58) Field of Classification Search
CPC .............. H01L 21/568; H01L 23/3128; H01L 23/5384; H01L 23/5389; H01L 24/18; H01L 24/97; H01L 25/105; H01L 21/6835
USPC .................. 257/737, 774, E23.011, E23.068
See application file for complete search history.

(56) References Cited

U.S. PATENT DOCUMENTS 5,250,843 A   10/1993   Eichelberger
5,353,498 A   10/1994   Fillion et al.
(Continued)

FOREIGN PATENT DOCUMENTS

WO   WO 2007129458   * 11/2007 ..................... 257/686

*Primary Examiner* — Walter H Swanson
(74) *Attorney, Agent, or Firm* — Robert D. Atkins; Patent Law Group: Atkins and Associates, P.C.

(57) ABSTRACT

A semiconductor device is made by forming a first conductive layer over a sacrificial carrier. A conductive pillar is formed over the first conductive layer. An active surface of a semiconductor die is mounted to the carrier. An encapsulant is deposited over the semiconductor die and around the conductive pillar. The carrier and adhesive layer are removed. A stress relief insulating layer is formed over the active surface of the semiconductor die and a first surface of the encapsulant. The stress relief insulating layer has a first thickness over the semiconductor die and a second thickness less than the first thickness over the encapsulant. A first interconnect structure is formed over the stress relief insulating layer. A second interconnect structure is formed over a second surface of encapsulant opposite the first interconnect structure. The first and second interconnect structures are electrically connected through the conductive pillar.

25 Claims, 11 Drawing Sheets

(51) Int. Cl.
  *H01L 21/56* (2006.01)
  *H01L 21/683* (2006.01)
  *H01L 23/31* (2006.01)
  *H01L 23/538* (2006.01)
  *H01L 23/00* (2006.01)
  *H01L 25/10* (2006.01)
  *H01L 23/66* (2006.01)

(52) U.S. Cl.
  CPC ... *H01L2224/20* (2013.01); *H01L 2224/48091* (2013.01); *H01L 2224/97* (2013.01); *H01L 2924/01004* (2013.01); *H01L 2924/01013* (2013.01); *H01L 2924/01029* (2013.01); *H01L 2924/01046* (2013.01); *H01L 2924/01047* (2013.01); *H01L 2924/01073* (2013.01); *H01L 2924/01074* (2013.01); *H01L 2924/01078* (2013.01); *H01L 2924/01079* (2013.01); *H01L 2924/01082* (2013.01); *H01L 2924/01322* (2013.01); *H01L 2924/04941* (2013.01); *H01L 2924/04953* (2013.01); *H01L 2924/09701* (2013.01); *H01L 2924/13091* (2013.01); *H01L 2924/14* (2013.01); *H01L 2924/1433* (2013.01); *H01L 2924/15311* (2013.01); *H01L 2924/15331* (2013.01); *H01L 2924/19041* (2013.01); *H01L 2924/19042* (2013.01); *H01L 2924/19043* (2013.01); *H01L 2924/30105* (2013.01); *H01L 24/48* (2013.01); *H01L 2924/01006* (2013.01); *H01L 2924/01023* (2013.01); *H01L 2924/01024* (2013.01); *H01L 2924/014* (2013.01); *H01L 2225/1035* (2013.01); *H01L 2225/1058* (2013.01); *H01L 2924/12041* (2013.01)

(56) References Cited

U.S. PATENT DOCUMENTS

| | | |
|---|---|---|
| 5,841,193 A | 11/1998 | Eichelberger |
| 6,028,364 A | 2/2000 | Ogino et al. |
| 6,197,613 B1 | 3/2001 | Kung et al. |
| 6,423,571 B2 | 7/2002 | Ogino et al. |
| 6,946,325 B2 | 9/2005 | Yean et al. |
| 7,192,807 B1 | 3/2007 | Huemoeller et al. |
| 7,619,901 B2 | 11/2009 | Eichelberger et al. |
| 2004/0080025 A1 | 4/2004 | Kasahara et al. |
| 2005/0006737 A1 | 1/2005 | Islam et al. |
| 2008/0029890 A1 | 2/2008 | Cheng |
| 2008/0111233 A1 | 5/2008 | Pendse |
| 2008/0122117 A1 | 5/2008 | Pendse |
| 2009/0206461 A1 | 8/2009 | Yoon |
| 2009/0236686 A1 | 9/2009 | Shim et al. |
| 2009/0243065 A1* | 10/2009 | Sugino et al. .......... 257/686 |
| 2009/0261466 A1 | 10/2009 | Pagaila et al. |

* cited by examiner

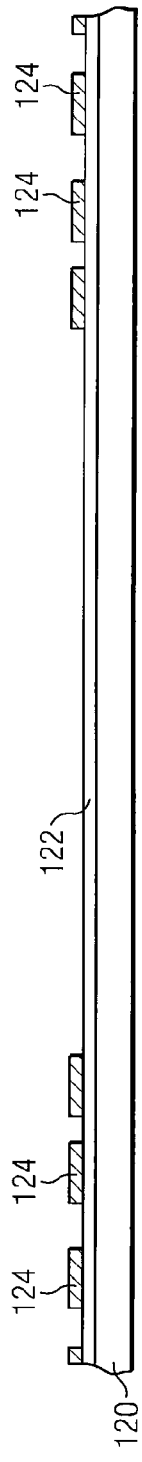
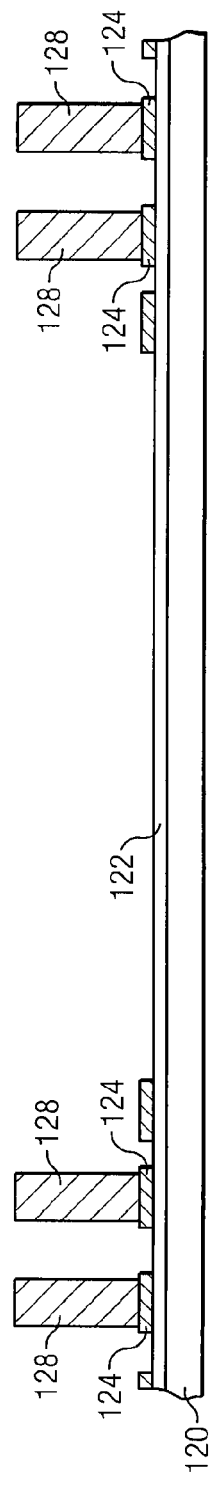
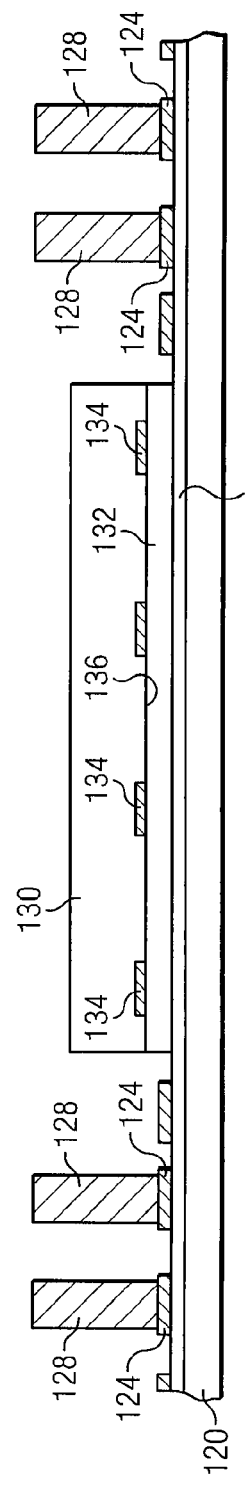

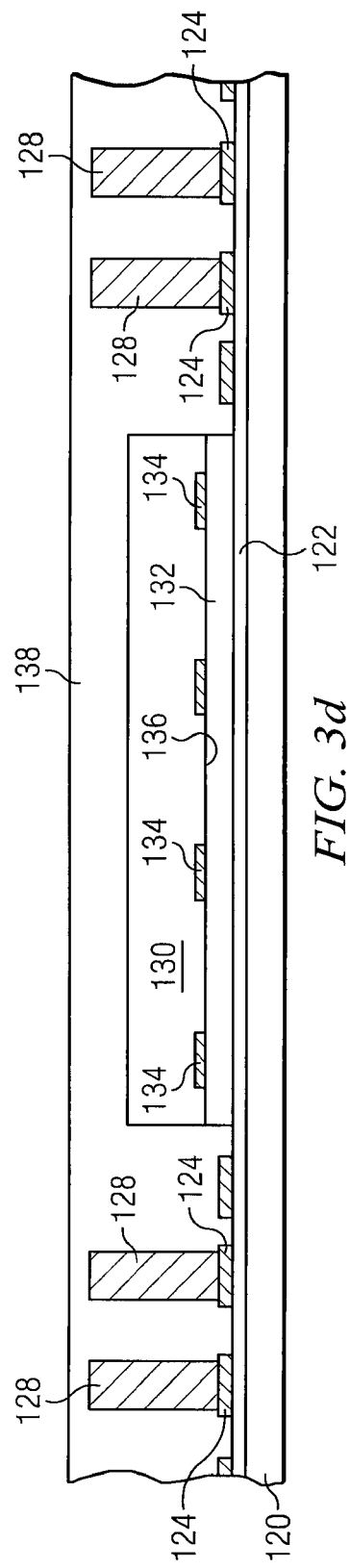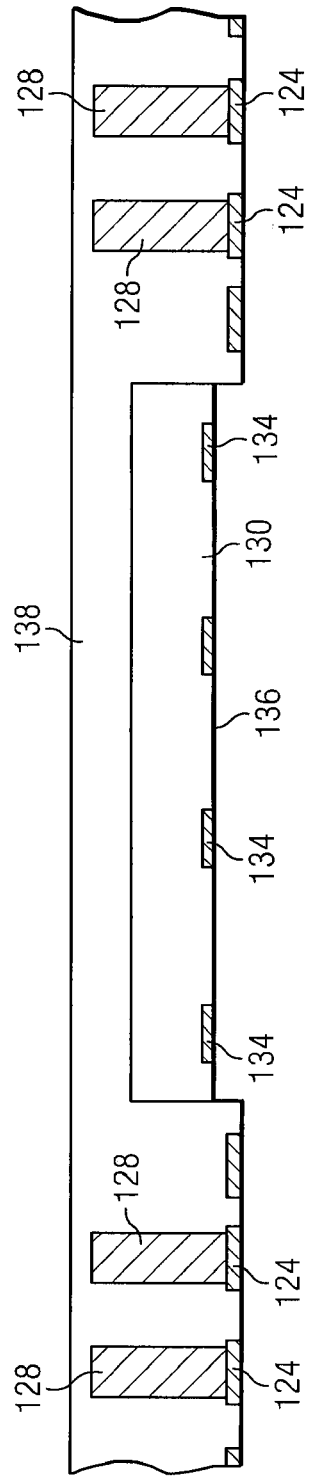
FIG. 3d
FIG. 3e

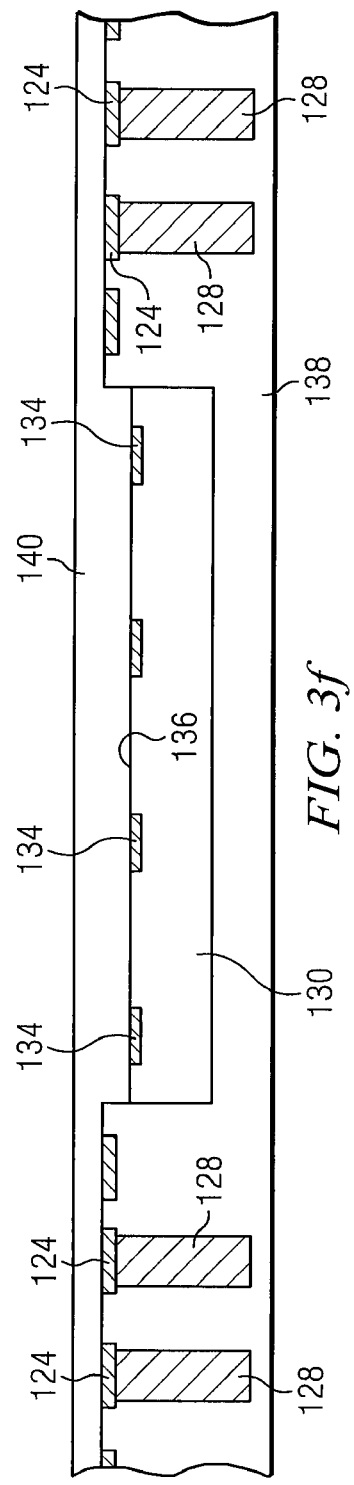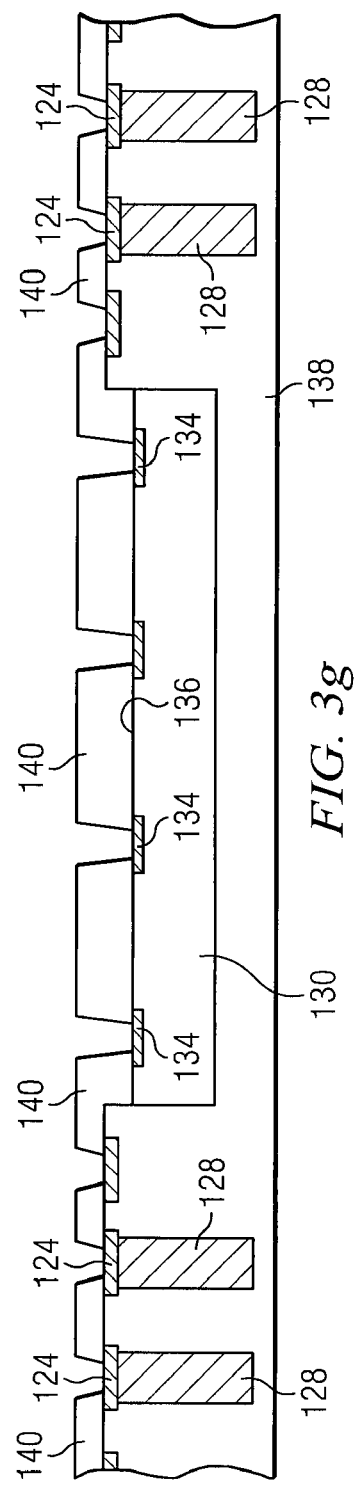

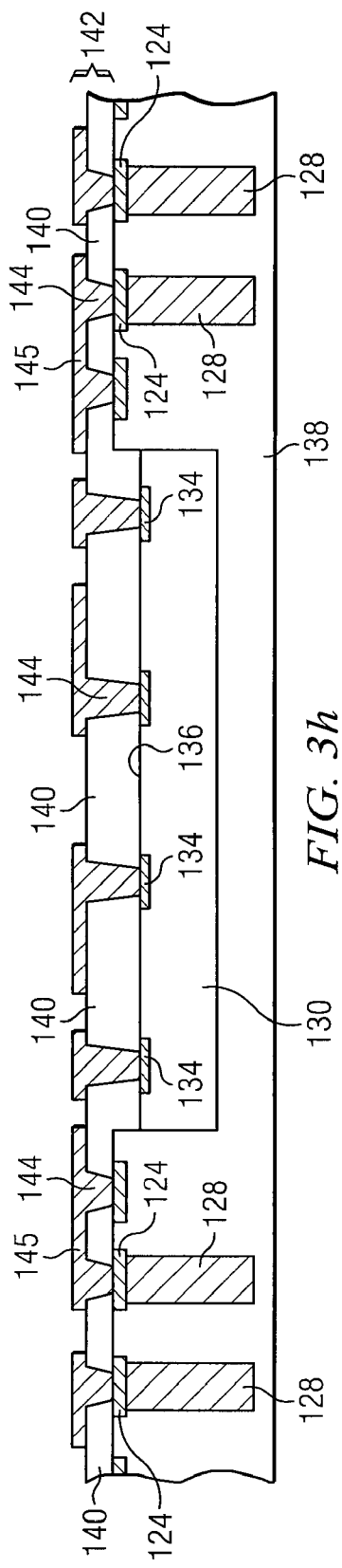
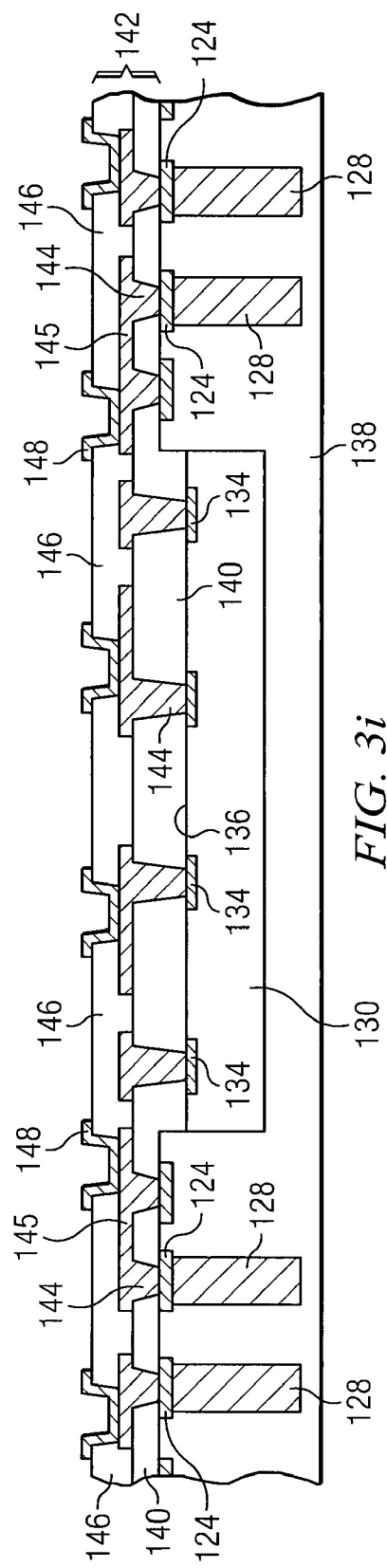

SEMICONDUCTOR DEVICE AND METHOD OF FORMING STRESS RELIEF LAYER BETWEEN DIE AND INTERCONNECT STRUCTURE

CLAIM TO DOMESTIC PRIORITY

The present application is a division of U.S. patent application Ser. No. 12/481,404, filed Jun. 9, 2009, now U.S. Pat. No. 8,039,303, which claims the benefit of U.S. Provisional Application No. 61/060,778, filed Jun. 11, 2008.

FIELD OF THE INVENTION

The present invention relates in general to semiconductor devices and, more particularly, to a semiconductor device and method of forming a stress relief insulating layer between a semiconductor die and build-up interconnect structure.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection between stacked semiconductor die can be accomplished with conductive through silicon vias (TSVs) or through hole vias (THVs) and an intermediate build-up interconnect layer. To form TSVs or THVs, a via is cut through the semiconductor material or peripheral region around the semiconductor die. The vias are then filled with an electrically conductive material, for example, copper deposition through an electroplating process. A potential mismatch between the coefficient of thermal expansion (CTE) of the semiconductor die and mounting board or intermediate build-up interconnect layer causes stress which can lead to THV or TSV joint failure and delamination of the die from the adjacent interconnect structure. These device failures reduce yield and increase manufacturing costs.

SUMMARY OF THE INVENTION

A need exists to provide a vertical interconnect structure for stacked semiconductor devices with a lower failure rate. Accordingly, in one embodiment, the present invention is a semiconductor device comprising a semiconductor die. A plurality of conductive pillars is formed around the semiconductor die. A conductive layer is formed over the conductive pillars and is vertically offset from the semiconductor die. A stress relief insulating layer is formed over the semiconductor die and the conductive layer. The stress relief insulating layer has a first thickness over the semiconductor die and a second thickness less than the first thickness over the conductive layer. An encapsulant is deposited over the semiconductor die and around the conductive pillars. A first interconnect structure is formed over the stress relief insulating layer. A second interconnect structure is formed over the encapsulant opposite the stress relief insulating layer.

In another embodiment, the present invention is a semiconductor device comprising a semiconductor die. A plurality of conductive pillars is formed around the semiconductor die. A stress relief insulating layer is formed over the semiconductor die and the conductive pillars. The stress relief insulating layer has a first thickness over the semiconductor die and a second thickness less than the first thickness over the conductive pillars. An encapsulant is deposited over the semiconductor die and around the conductive pillars. A first interconnect structure is formed over the stress relief insulating layer. A second interconnect structure is formed over the encapsulant opposite the stress relief insulating layer.

In another embodiment, the present invention is a semiconductor device comprising a semiconductor die. A plurality of conductive pillars is formed around the semiconductor die. A stress relief insulating layer is formed over the semiconductor die and the conductive pillars. The stress relief insulating layer has a first thickness over the semiconductor die and a second thickness less than the first thickness over the conductive pillars. An encapsulant is deposited over the semiconductor die and around the conductive pillars. A first interconnect structure is formed over the stress relief insulating layer.

In another embodiment, the present invention is a semiconductor device comprising a semiconductor die. A plurality of conductive pillars is formed around the semiconductor die. A stress relief insulating layer is formed over the semiconductor die and the conductive pillars. An encapsulant is deposited over the semiconductor die and around the conductive pillars. A first interconnect structure is formed over the stress relief insulating layer.

BRIEF DESCRIPTION OF THE DRAWINGS

FIGS. 3a-3m illustrate a process of forming a vertical interconnect structure using conductive pillars and stress relief layer between die and build-up interconnect structure;

DETAILED DESCRIPTION OF THE DRAWINGS

Figure 1:
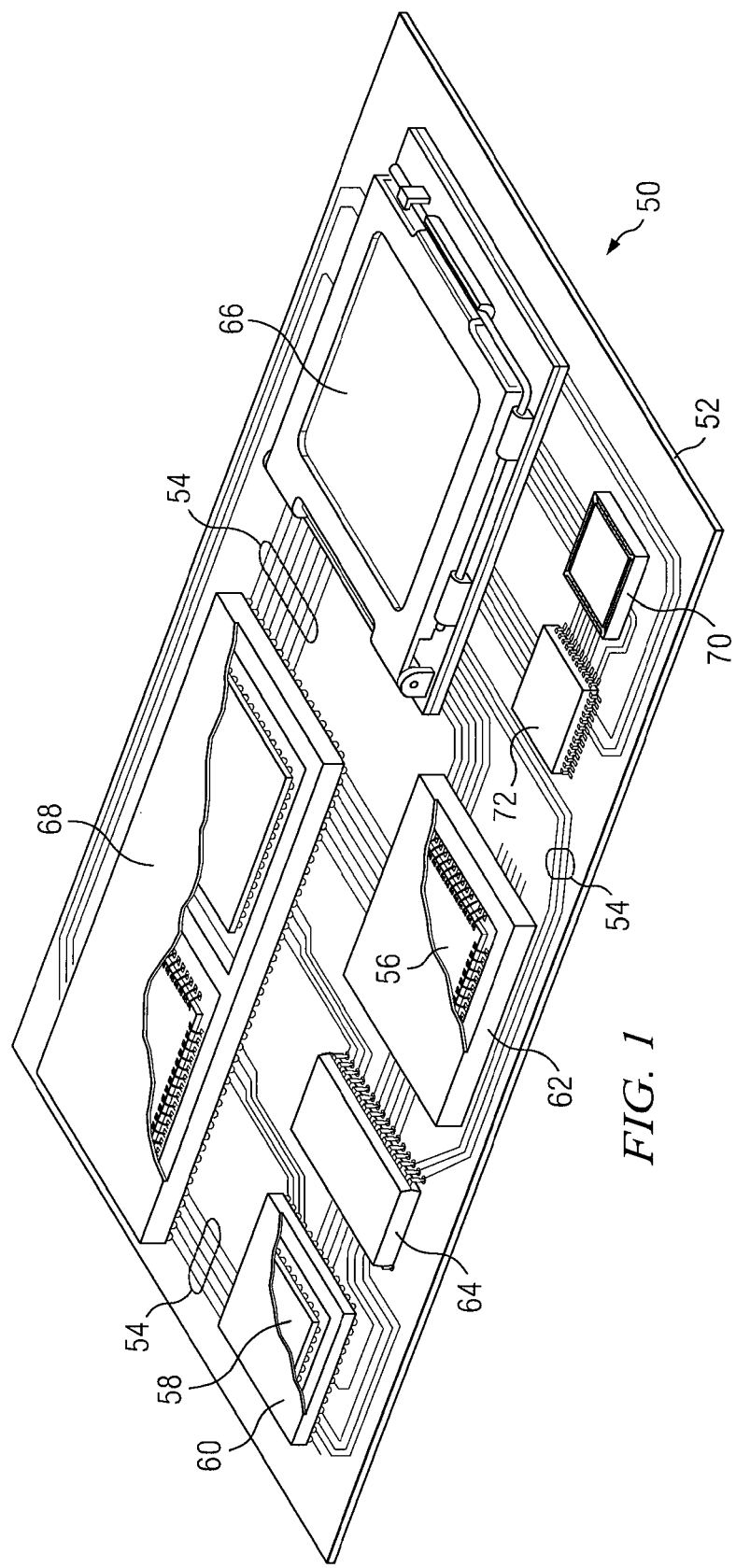
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or PCB 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
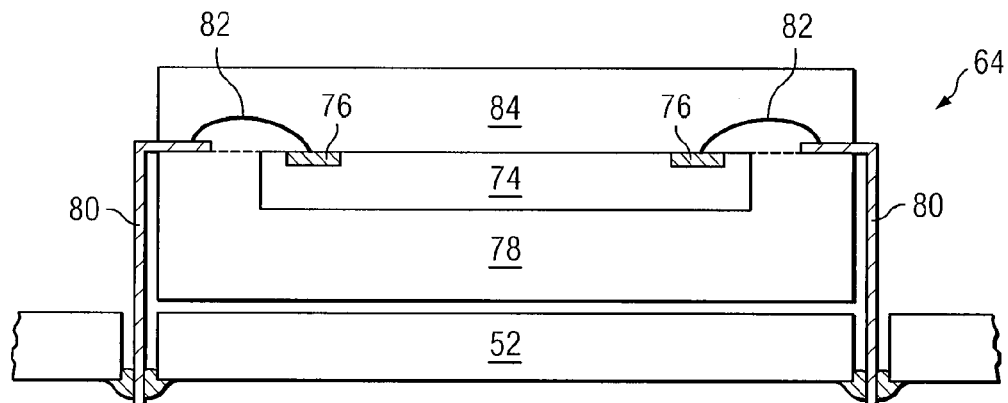
FIGS. 2a-2c illustrate further detail of the representative semiconductor packages mounted to the PCB.
Figure 2B:
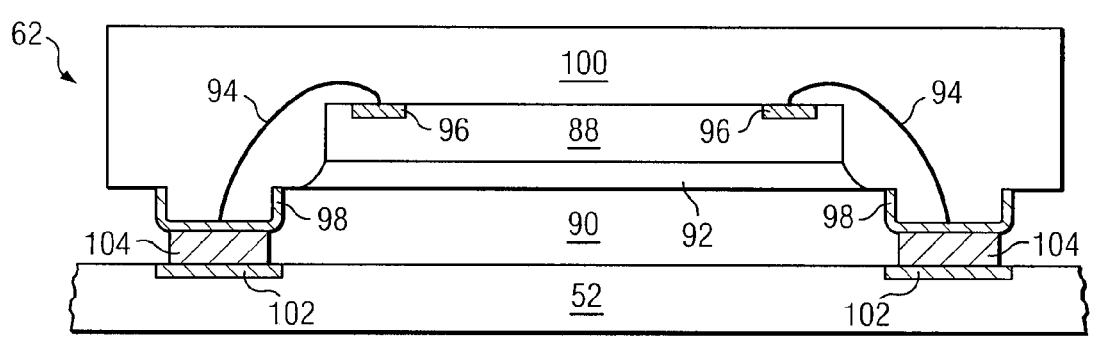
Figure 2C:
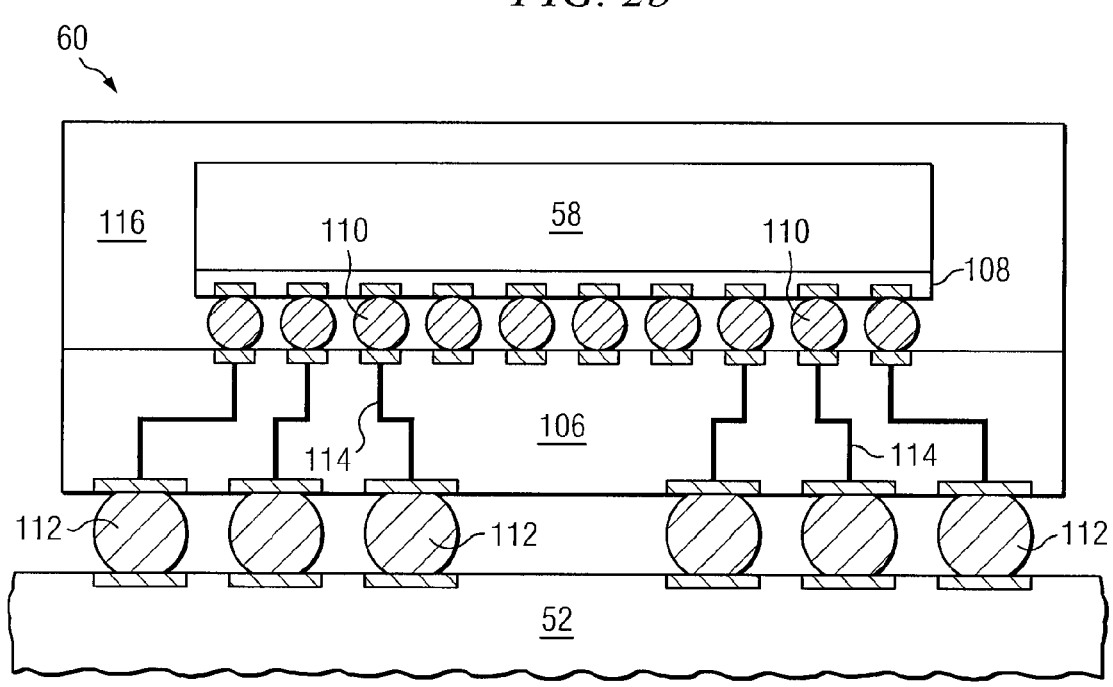

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packing interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition such electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3J:
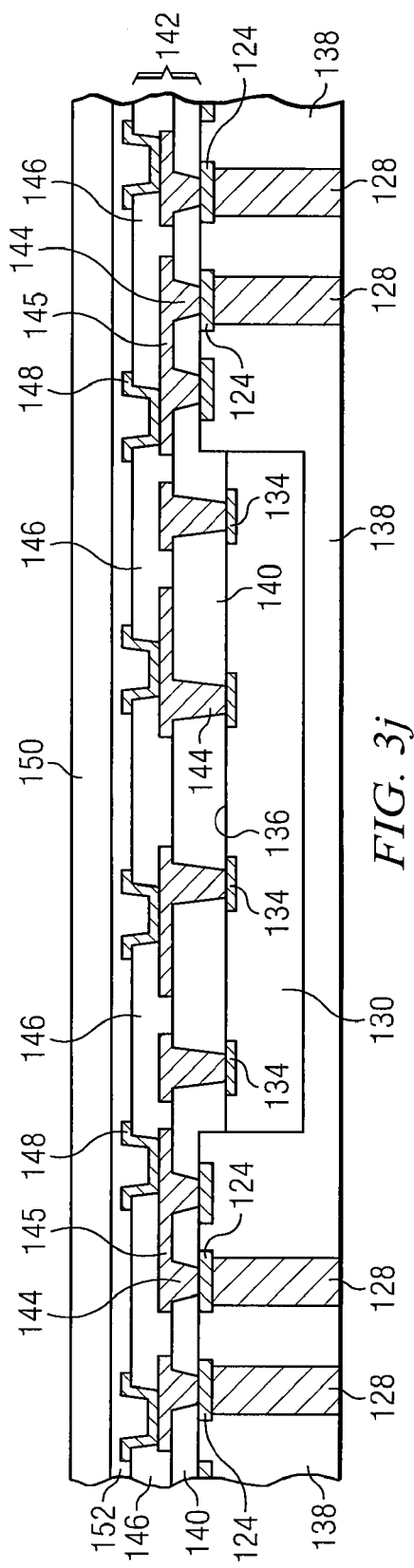

FIGS. 3a-3m illustrate a process of forming a vertical interconnect structure with conductive pillars and a stress relief layer between a semiconductor die and build-up interconnect structure. In FIG. 3a, a sacrificial or temporary substrate or carrier 120 contains a base material such as silicon, polymer, polymer composite, metal foil, ceramic, glass, glass epoxy, beryllium oxide, tape, or other suitable low-cost, rigid material for structural support. An optional interface layer 122 can be formed over carrier 120 as an etch-stop. An electrically conductive layer 124 is formed over carrier 120 using patterning with PVD, CVD, sputtering, electrolytic plating, electroless plating process, or other suitable metal deposition process. Conductive layer 124 can be one or more layers of Al, Cu, Sn, Ni, Au, Ag, W, poly-silicon, or other suitable electrically conductive material. Conductive layer 124 includes wettable contact pads for later formation of conductive pillars. In one embodiment, the wettable contact pads of conductive layer 124 are pre-plated on carrier 120.

In FIG. 3b, a plurality of conductive pillars or posts 128 are formed over the wettable contact pads of conductive layer 124. In one embodiment, conductive pillars 128 are formed by depositing one or more layers of photoresist over interface layer 122 or carrier 120. The portion of photoresist over conductive layer 124 is exposed and removed by an etch development process. Conductive material is deposited in the removed portion of the photoresist layer using a selective plating process. The photoresist layer is stripped away leaving behind individual conductive pillars 128. Conductive pillars 128 can be Cu, Al, tungsten (W), Au, solder, or other suitable electrically conductive material. Conductive pillars 128 have a height ranging from 2-120 micrometers (μm). In another embodiment, conductive pillars 128 can be formed as stud bumps or stacked bumps.

A plurality of semiconductor die or components 130 is mounted to interface layer 122 with protective adhesive layer 132 in a flipchip arrangement. Contact pads 134 and active surface 136 are oriented downward over interface layer 122 and carrier 120. Protective adhesive layer 132 can be one or more layers of ultraviolet (UV) curable and thermal stable adhesive tape. Protective adhesive layer 132 creates a vertical offset between active surface 136 and conductive layer 124.

Semiconductor die 130 includes an active surface 136 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 136 to implement baseband analog circuits or digital circuits, such as digital signal processor (DSP), ASIC, memory, or other signal processing circuit. Semiconductor die 130 may also contain IPD, such as inductors, capacitors, and resistors, for RF signal processing. In another embodiment, a discrete semiconductor component can be mounted to interface layer 122 or carrier 120. Conductive pillars 128 are disposed around semiconductor die 130.

FIG. 3d shows an encapsulant or molding compound 138 deposited over semiconductor die 130 and conductive pillars 128 using a paste printing, compressive molding, transfer molding, liquid encapsulant molding, vacuum lamination, or other suitable applicator. Encapsulant 138 can be polymer composite material, such as epoxy resin with filler, epoxy acrylate with filler, or polymer with proper filler. Encapsulant 138 is non-conductive and environmentally protects the semiconductor device from external elements and contaminants. Protective adhesive layer 132 prevents encapsulant 138 from bleeding into active surface 136.

In FIG. 3e, carrier 120, interface layer 122, and protective adhesive layer 132 are removed by chemical wet etching, plasma dry etching, mechanical peel-off, CMP, mechanical grinding, thermal bake, laser scanning, or wet stripping. Encapsulant 138 provides structural support for semiconductor die 130 after removal of carrier 120. Conductive layer 124 and contact pads 134 of semiconductor die 130 are exposed following removal of carrier 120, interface layer 122, and protective adhesive layer 132.

In FIG. 3f, the structure is inverted and a stress relief insulating layer 140 is formed over encapsulant 138, conductive layer 124, and active surface 136 using PVD, CVD, printing, spin coating, spray coating, sintering, or thermal oxidation. The stress relief insulating layer 140 can be one or more layers of silicon dioxide (SiO2), silicon nitride (Si3N4), silicon oxynitride (SiON), tantalum pentoxide (Ta2O5), aluminum oxide (Al2O3), or other material having similar insulating and structural properties. The insulating layer 140 is thicker over active region 136, due to vertical offset of protective adhesive layer 132, than over encapsulant 138 and conductive layer 124 to provide additional stress relief for semiconductor die 130. In one embodiment, the portion of insulating layer 140 over active region 136 has a thickness ranging from 5-100 μm, and the portion of insulating layer 140 over encapsulant 138 has a thickness ranging from 2-50 μm. A portion of insulating layer 140 is removed by a patterning and etching process to expose conductive layer 124 and contact pads 134, as shown in FIG. 3g.

In FIG. 3h, a bottom-side build-up interconnect structure 142 is formed over insulating layer 140. An electrically conductive layer 144 is formed over insulating layer 140, conductive layer 124, and contact pads 134 using patterning with PVD, CVD, sputtering, electrolytic plating, electroless plating process, or other suitable metal deposition process. Conductive layer 144 can be one or more layers of Al, Cu, Sn, Ni, Au, Ag, or other suitable electrically conductive material. Portions of conductive layer 144 are electrically connected to conductive pillars 128, conductive layer 124, and contact pads 134. Other portions of conductive layer 144 can be electrically common or electrically isolated depending on the design and function of the semiconductor device. For example, portion 145 of conductive layer 144 operates as a redistribution layer (RDL) or runner to extend the conductivity of conductive pillars 128 and conductive layer 124.

In FIG. 3i, an insulating or passivation layer 146 is formed over insulating layer 140 and conductive layer 144 using PVD, CVD, printing, spin coating, spray coating, sintering, or thermal oxidation. The passivation layer 146 can be one or more layers of SiO2, Si3N4, SiON, Ta2O5, Al2O3, or other material having similar insulating and structural properties. A portion of passivation layer 146 is removed by an etching process to expose conductive layer 144.

An electrically conductive layer 148 is formed over passivation layer 146 and conductive layer 144 using patterning with PVD, CVD, sputtering, electrolytic plating, electroless plating process, or other suitable metal deposition process. Conductive layer 148 can be one or more layers of Al, Cu, Sn, Ni, Au, Ag, or other suitable electrically conductive material. Conductive layer 148 is electrically connected to conductive layer 144. Conductive layer 148 is an under bump metallization (UBM) in electrical contact with conductive layer 144 and conductive pillars 128. UBM 148 can be a multi-metal stack with adhesion layer, barrier layer, and seed or wetting layer. The adhesion layer is formed over conductive layer 144 and can be Ti, titanium nitride (TiN), titanium tungsten (TiW), Al, or chromium (Cr). The barrier layer is formed over the adhesion layer and can be made of Ni, nickel vanadium (NiV), platinum (Pt), palladium (Pd), TiW, or chromium copper (CrCu). The barrier layer inhibits the diffusion of Cu into the active area of the die. The seed layer can be Cu, Ni, NiV, Au, or Al. The seed layer is formed over the barrier layer and acts as an intermediate conductive layer between conductive layer 144 and subsequent solder bumps or other interconnect structure. UBM 148 provides a low resistive interconnect to conductive layer 144, as well as a barrier to solder diffusion and seed layer for solder wettability.

In FIG. 3j, encapsulant 138 undergoes grinding or plasma etching to planarize the surface for formation of the topside build-up interconnect structure. The grinding operation exposes a surface of conductive pillars 128. An optional process carrier 150, such as backgrinding tape, can be mounted to passivation layer 146 and conductive layer 148 with adhesive layer 152 for additional structural support during the grinding operation.

Figure 3K:
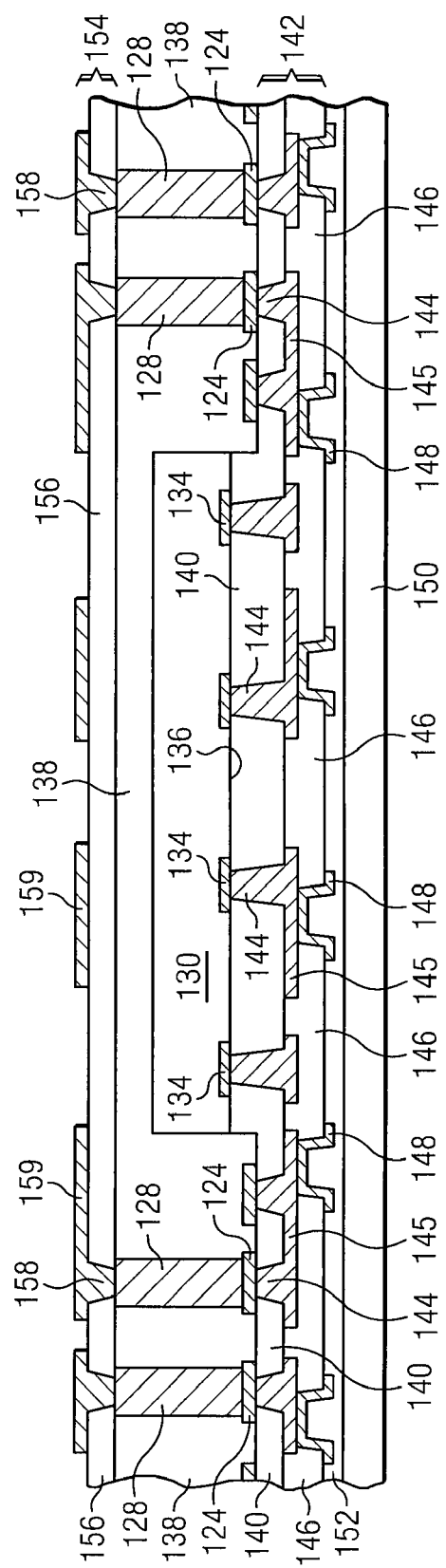

In FIG. 3k, the structure is inverted and a topside build-up interconnect structure 154 is formed over encapsulant 138 and conductive pillars 128. An insulating or passivation layer 156 is formed over encapsulant 138 and conductive pillars 128 using PVD, CVD, printing, spin coating, spray coating, sintering, or thermal oxidation. The passivation layer 156 can be one or more layers of SiO2, Si3N4, SiON, Ta2O5, Al2O3, or other material having similar insulating and structural properties. A portion of passivation layer 156 is removed by an etching process to expose conductive pillars 128.

An electrically conductive layer 158 is formed over passivation layer 156 and conductive pillars 128 using patterning with PVD, CVD, sputtering, electrolytic plating, electroless plating process, or other suitable metal deposition process. Conductive layer 158 can be one or more layers of Al, Cu, Sn, Ni, Au, Ag, or other suitable electrically conductive material. A portion of conductive layer 158 is electrically connected to conductive pillars 128. Other portions of conductive layer 158 can be electrically common or electrically isolated depending on the design and function of the semiconductor device. For example, portion 159 of conductive layer 158 operates as an RDL or runner to extend the conductivity of conductive pillars 128.

Figure 3L:
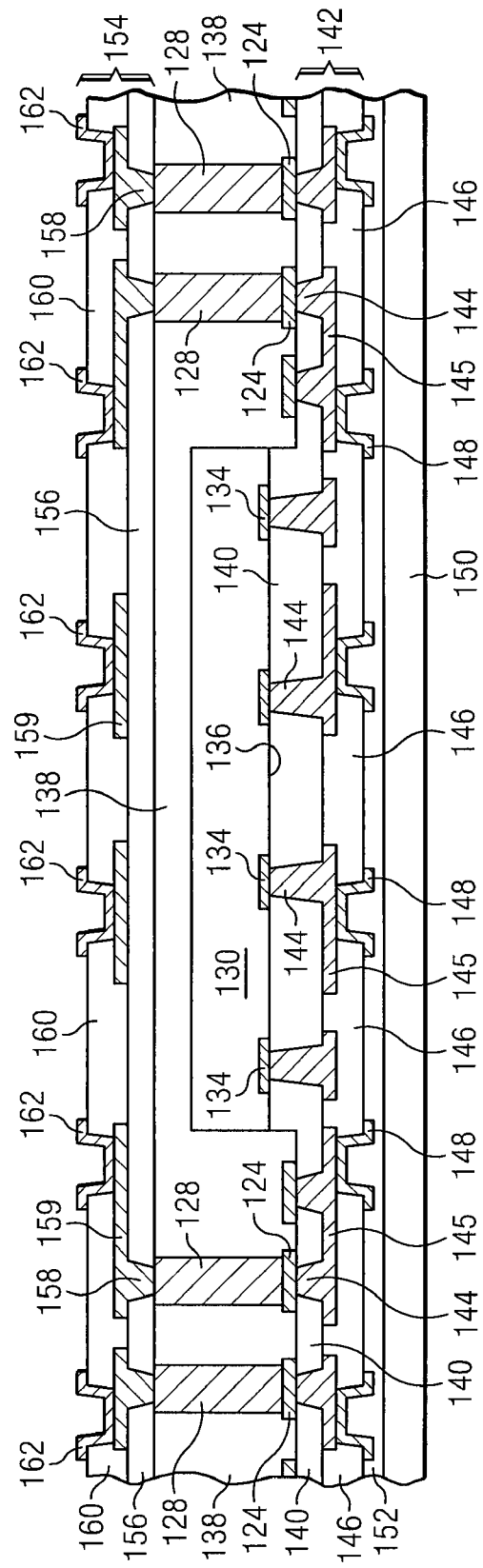

In FIG. 3l, an insulating or passivation layer 160 is formed over passivation layer 156 and conductive layer 158 using PVD, CVD, printing, spin coating, spray coating, sintering, or thermal oxidation. The passivation layer 160 can be one or more layers of SiO2, Si3N4, SiON, Ta2O5, Al2O3, or other material having similar insulating and structural properties. A portion of passivation layer 160 is removed by an etching process to expose conductive layer 158.

An electrically conductive layer 162 is formed over passivation layer 160 and conductive layer 158 using patterning with PVD, CVD, sputtering, electrolytic plating, electroless plating process, or other suitable metal deposition process. Conductive layer 162 can be one or more layers of Al, Cu, Sn, Ni, Au, Ag, or other suitable electrically conductive material. Conductive layer 162 is a UBM in electrical contact with conductive layer 158 and conductive pillars 128. UBM 162 can be a multi-metal stack with adhesion layer, barrier layer, and seed or wetting layer. The adhesion layer is formed over conductive layer 158 and can be Ti, TiN, TiW, Al, or Cr. The barrier layer is formed over the adhesion layer and can be made of Ni, NiV, Pt, Pd, TiW, or CrCu. The barrier layer inhibits the diffusion of Cu into the active area of the die. The seed layer can be Cu, Ni, NiV, Au, or Al. The seed layer is formed over the barrier layer and acts as an intermediate conductive layer between conductive layer 158 and subsequent solder bumps or other interconnect structure. UBM 162 provides a low resistive interconnect to conductive layer 158, as well as a barrier to solder diffusion and seed layer for solder wettability.

Figure 3M:
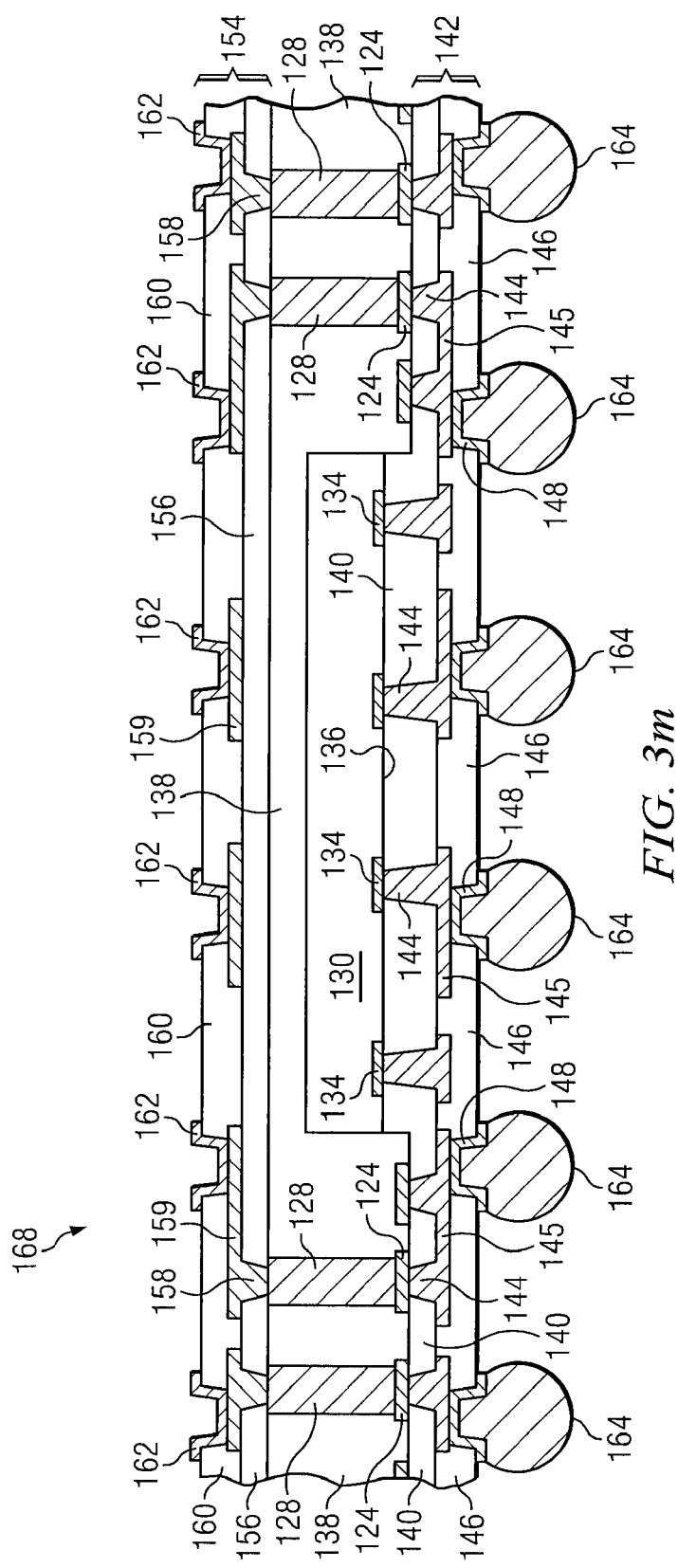

In FIG. 3m, carrier 150 and adhesive layer 152 is removed by chemical wet etching, plasma dry etching, mechanical peel-off, CMP, mechanical grinding, thermal bake, laser scanning, or wet stripping. The bottom-side build-up interconnect structure 142 includes conductive layer 144, passivation layer 146, and UBM 148. The topside build-up interconnect structure 154 includes passivation layer 156, conductive layer 158, passivation layer 160, and UBM 162.

An electrically conductive bump material is deposited over UBM 148 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 148 using a suitable attachment or bonding process. In one embodiment, the bump material is reflowed by heating the material above its melting point to form spherical balls or bumps 164. In some applications, bumps 164 are reflowed a second time to improve electrical contact to UBM 148. The bumps can also be compression bonded to UBM 148. Bumps 164 represent one type of interconnect structure that can be formed over UBM 148. The interconnect structure can also use bond wires, conductive paste, stud bump, micro bump, or other electrical interconnect.

Figure 4:
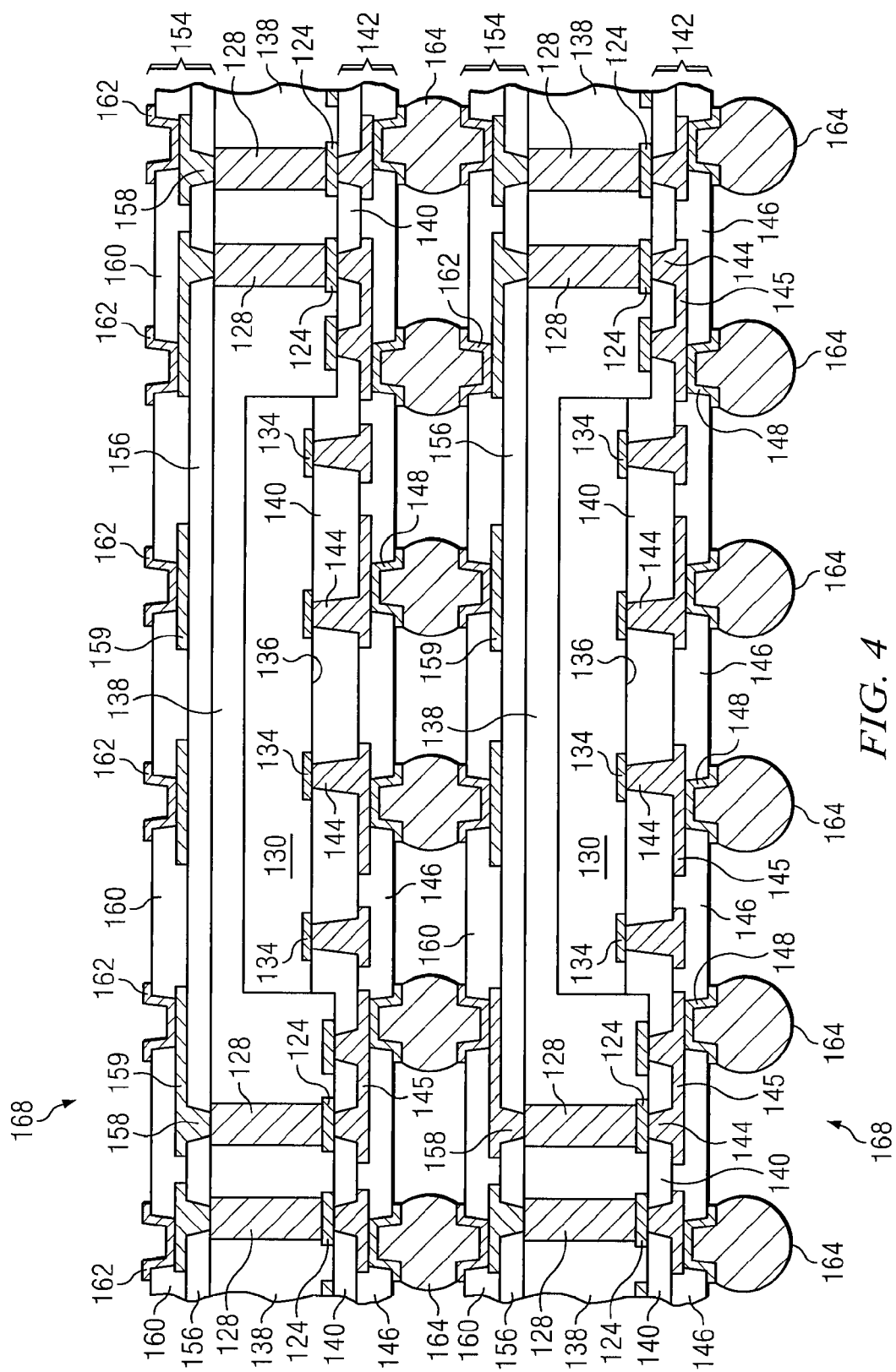
FIG. 4 illustrates stacked semiconductor devices electrically interconnected with the conductive pillars.

Semiconductor die 130 are singulated with saw blade or laser cutting tool into individual semiconductor devices 168. After singulation, the individual semiconductor devices 168 can be stacked, as shown in FIG. 4. Conductive pillars 128 provide vertical, z-direction interconnect between topside build-up interconnect layer 154 and bottom-side build-up interconnect layer 142. Conductive layer 158 is electrically connected through conductive pillars 128 to conductive layer 122 and contact pads 134 of each semiconductor device 168.

The thick protective insulating layer 140 disposed over active surface 136 reduces stress caused by CTE mismatch between semiconductor die 130 and bottom-side build-up interconnect structure 142. The stress buffering provided by insulating layer 140 reduces joint failure rate of conductive pillars 138 and delamination between semiconductor die 130 and build-up interconnect structure 142.

Figure 5:
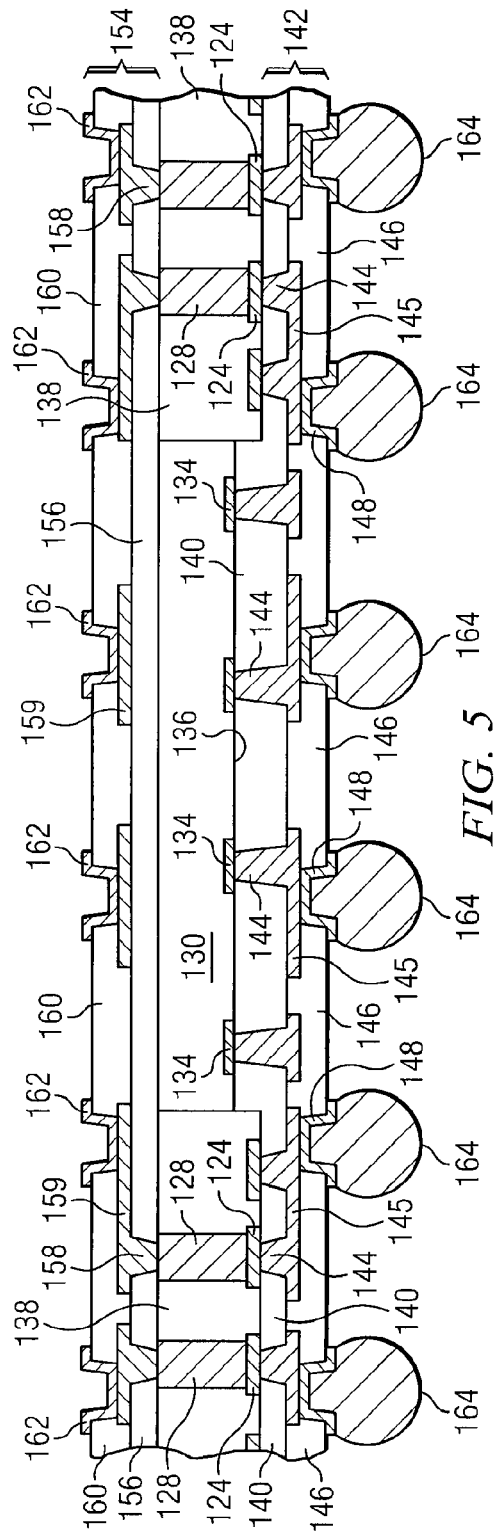
FIG. 5 illustrates a back surface of the semiconductor die coplanar with a surface of the conductive pillars.

FIG. 5 shows a variation of the process flow of FIG. 3j. Encapsulant 138 and conductive pillars 128 undergo grinding or plasma etching to planarize the surface of the encapsulant for the topside build-up interconnect layer 154. The grinding operation exposes a back surface of semiconductor die 130 coplanar with the exposed surface of conductive pillars 128. The remainder of the process follows the description of FIGS. 3k-3m.

Figure 6:
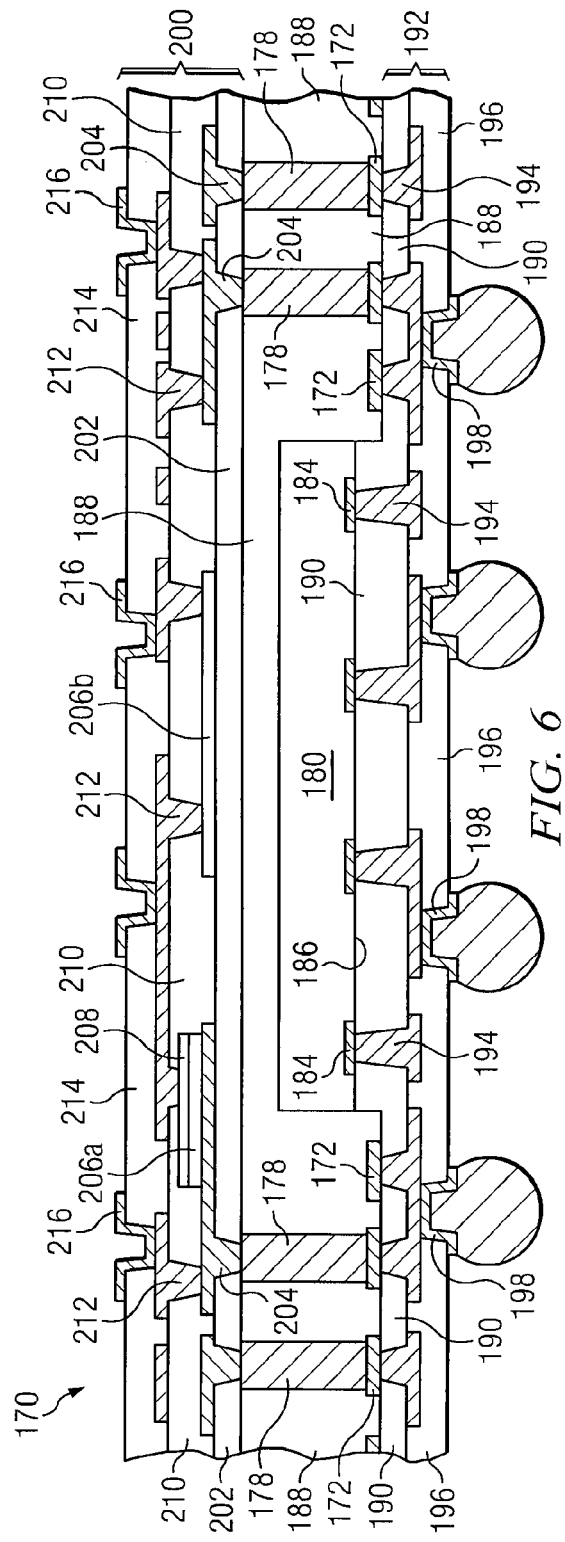
FIG. 6 illustrates the semiconductor device with IPD formed in a topside interconnect structure.

FIG. 6 illustrates an embodiment of the vertical interconnect structure with multiple IPD formed in the topside interconnect structure. Similar to the process described in FIGS. 3a-3m, semiconductor device 170 uses a sacrificial or temporary substrate or carrier with an optional interface layer, which operates as an etch-stop layer. An electrically conductive layer 172 is formed over the carrier using patterning with PVD, CVD, sputtering, electrolytic plating, electroless plating process, or other suitable metal deposition process. Conductive layer 172 can be one or more layers of Al, Cu, Sn, Ni, Au, Ag, W, poly-silicon, or other suitable electrically conductive material. Conductive layer 172 includes wettable contact pads for later formation of conductive pillars.

A plurality of conductive pillars or posts 178 is formed over the wettable contact pads of conductive layer 172. In one embodiment, conductive pillars 178 are formed by depositing one or more layers of photoresist over the carrier and interface layer. The portion of photoresist over conductive layer 172 is exposed and removed by an etching development process. Conductive material is deposited in the removed portion of the photoresist layer using a selective plating process. The photoresist layer is stripped away leaving behind individual conductive pillars 178. Conductive pillars 178 can be Cu, Al, W, Au, solder, or other suitable electrically conductive material. Conductive pillars 178 have a height ranging from 2-120 μm. In another embodiment, conductive pillars 178 can be formed as stud bumps or stacked bumps.

A plurality of semiconductor die or components 180 is mounted to the interface layer with a protective adhesive layer in a flipchip arrangement. Contact pads 184 and active surface 186 are oriented downward over the interface layer and carrier. The protective adhesive layer can be one or more layers of UV curable and thermal stable adhesive tape. The protective adhesive layer creates a vertical offset between active surface 186 and conductive layer 172. Semiconductor die 180 includes an active surface 186 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 186 to implement baseband analog circuits or digital circuits, such as DSP, ASIC, memory, or other signal processing circuit. Semiconductor die 180 may also contain IPD, such as inductors, capacitors, and resistors, for RF signal processing. In another embodiment, a discrete semiconductor component can be mounted to the interface layer or carrier.

An encapsulant or molding compound 188 is deposited over semiconductor die 180 and conductive pillars 178 using a paste printing, compressive molding, transfer molding, liquid encapsulant molding, vacuum lamination, or other suitable applicator. Encapsulant 188 can be polymer composite material, such as epoxy resin with filler, epoxy acrylate with filler, or polymer with proper filler. Encapsulant 188 is non-conductive and environmentally protects the semiconductor device from external elements and contaminants.

The carrier, interface layer, and protective adhesive layer are removed by chemical wet etching, plasma dry etching, mechanical peel-off, CMP, mechanical grinding, thermal bake, laser scanning, or wet stripping. Encapsulant 188 provides structural support for semiconductor die 180 after removal of the carrier. Conductive layer 172 and contact pads 184 of semiconductor die 180 are exposed following removal of the carrier and interface layer.

The structure is inverted and an insulating layer 190 is formed over encapsulant 188, conductive layer 172, and active surface 186. The insulating layer 190 is thicker over active region 186, due to vertical offset of the protective adhesive layer, than over encapsulant 188 and conductive layer 172. A portion of insulating layer 190 is removed by a patterning and etching process to expose conductive layer 172 and contact pads 184.

A bottom-side build-up interconnect structure 192 is formed over insulating layer 190. The build-up interconnect structure 190 includes an electrically conductive layer 194, insulating or passivation layer 196, and UBM 198.

Encapsulant 188 undergoes grinding or plasma etching to planarize the surface for the topside build-up interconnect structure. The grinding operation exposes the top surface of conductive pillars 178 and, optionally, the back surface of semiconductor die 180, as described in FIG. 5. An optional process carrier can be mounted to passivation layer 196 and conductive layer 198 for additional structural support during the grinding operation.

The structure is inverted and a topside build-up interconnect structure 200 is formed over encapsulant 188 and conductive pillars 178. The build-up interconnect structure 200 includes one or more IPDs. An insulating or passivation layer 202 is formed over encapsulant 188 and conductive pillars 178 using spin coating, PVD, CVD, printing, sintering, or thermal oxidation. The passivation layer 202 can be one or more layers of SiO2, Si3N4, SiON, Ta2O5, Al2O3, or other material having suitable insulating properties. A portion of passivation layer 202 is removed to expose conductive pillars 178.

An electrically conductive layer 204 is formed over insulating layer 202 using patterning with PVD, CVD, sputtering, electrolytic plating, electroless plating process, or other suitable metal deposition process to form individual portions or sections. The individual portions of conductive layer 204 can be electrically common or electrically isolated depending on the connectivity of the individual semiconductor die. Conductive layer 204 can be one or more layers of Al, Cu, Sn, Ni, Au, Ag, or other suitable electrically conductive material. One portion of conductive layer 204 is electrically connected to conductive pillars 178. Other portions of conductive layer 204 can be electrically common or electrically isolated depending on the design and function of the semiconductor device.

A resistive layer 206a-206b are patterned and deposited over conductive layer 204 and insulating layer 202, respectively, using PVD or CVD. Resistive layer 206 is tantalum silicide (TaxSiy) or other metal silicides, TaN, nickel chromium (NiCr), TiN, or doped poly-silicon having a resistivity between 5 and 100 ohm/sq. An insulating layer 208 is formed over resistive layer 206a using PVD, CVD, printing, sintering, or thermal oxidation. The insulating layer 208 can be one or more layers of Si3N4, SiO2, SiON, Ta2O5, ZnO, ZrO2, Al2O3, polyimide, BCB, PBO, or other suitable dielectric material. Resistive layer 206 and insulating layer 208 can be formed with the same mask and etched at the same time. Alternatively, resistive layer 206 and insulating layer 208 can be patterned and etched with a different mask.

An insulating or passivation layer 210 is formed over passivation layer 202, conductive layer 204, resistive layer 206, and insulating layer 208 using spin coating, PVD, CVD, printing, sintering, or thermal oxidation. The passivation layer 210 can be one or more layers of SiO2, Si3N4, SiON, Ta2O5, Al2O3, or other material having suitable insulating properties. A portion of passivation layer 210 is removed to expose conductive layer 204, resistive layer 206, and insulating layer 208.

An electrically conductive layer 212 is patterned and deposited over passivation layer 210, conductive layer 204, resistive layer 206, and insulating layer 208 using PVD, CVD, sputtering, electrolytic plating, electroless plating process, or other suitable metal deposition process to form individual portions or sections for further interconnectivity. The individual portions of conductive layer 212 can be electrically common or electrically isolated depending on the connectivity of the individual semiconductor die. Conductive layer 212 can be one or more layers of Al, Cu, Sn, Ni, Au, Ag, or other suitable electrically conductive material.

An insulating or passivation layer 214 is formed over conductive layers 212 and passivation layer 210 using spin coating, PVD, CVD, printing, sintering, or thermal oxidation. The passivation layer 214 can be one or more layers of SiO2, Si3N4, SiON, Ta2O5, Al2O3, or other material having suitable insulating properties. A portion of passivation layer 214 is removed to expose conductive layer 212.

An electrically conductive layer 216 is patterned and deposited over passivation layer 214 and conductive layer 212 using PVD, CVD, sputtering, electrolytic plating, electroless plating process, or other suitable metal deposition process. Conductive layer 216 can be one or more layers of Al, Cu, Sn, Ni, Au, Ag, or other suitable electrically conductive material. Conductive layer 216 is a UBM in electrical contact with conductive layers 212 and 204 and conductive pillars 178.

The structures described in build-up interconnect structure 200 constitute one or more passive circuit elements or IPDs. In one embodiment, conductive layer 204, resistive layer 206a, insulating layer 208, and conductive layer 212 is a metal-insulator-metal (MIM) capacitor. Resistive layer 206b is a resistor element in the passive circuit. The individual sections of conductive layer 212 can be wound or coiled in plan-view to produce or exhibit the desired properties of an inductor.

The IPD structure provides electrical characteristics needed for high frequency applications, such as resonators, high-pass filters, low-pass filters, band-pass filters, symmetric Hi-Q resonant transformers, matching networks, and tuning capacitors. The IPDs can be used as front-end wireless RF components, which can be positioned between the antenna and transceiver. The inductor can be a hi-Q balun, transformer, or coil, operating up to 100 Gigahertz. In some applications, multiple baluns are formed over a same substrate, allowing multi-band operation. For example, two or more baluns are used in a quad-band for mobile phones or other global system for mobile (GSM) communications, each balun dedicated for a frequency band of operation of the quad-band device. A typical RF system requires multiple IPDs and other high frequency circuits in one or more semiconductor packages to perform the necessary electrical functions.

The IPDs can be formed in either or both of the topside build-up interconnect structure and bottom-side build-up interconnect structure.

The optional carrier and adhesive layer over passivation layer 196 and UBM 198 are removed by chemical wet etching, plasma dry etching, mechanical peel-off, CMP, mechanical grinding, thermal bake, laser scanning, or wet stripping. An electrically conductive bump material is deposited over UBM 198 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to UBM 198 using a suitable attachment or bonding process. In one embodiment, the bump material is reflowed by heating the material above its melting point to form spherical balls or bumps 218. In some applications, bumps 218 are reflowed a second time to improve electrical contact to UBM 198. The bumps can also be compression bonded to UBM 198. Bumps 218 represent one type of interconnect structure that can be formed over UBM 198. The interconnect structure can also use bond wires, conductive paste, stud bump, micro bump, or other electrical interconnect.

Conductive pillars 178 provide vertical, z-direction interconnect between topside build-up interconnect layer 200 and bottom-side build-up interconnect layer 192. Conductive layers 204 and 212 are electrically connected through conductive pillars 178 to conductive layer 172 and contact pads 184 of semiconductor die 180.

The thick protective insulating layer 190 disposed over active surface 186 reduces stress caused by CTE mismatch between semiconductor die 180 and bottom-side build-up interconnect structure 192. The stress buffering provided by insulating layer 190 reduces joint failure rate of conductive pillars 178 and delamination between semiconductor die 180 and build-up interconnect structure 192.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
   a semiconductor die;
   a plurality of conductive pillars formed around the semiconductor die;
   a conductive layer formed over the conductive pillars and vertically offset from the semiconductor die;
   a stress relief insulating layer formed over the semiconductor die and the conductive layer, the stress relief insulating layer including a first thickness over the semiconductor die and a second thickness less than the first thickness over the conductive layer;
   an encapsulant deposited over the semiconductor die and around the conductive pillars;
   a first interconnect structure formed over the stress relief insulating layer; and
   a second interconnect structure formed over the encapsulant opposite the stress relief insulating layer.

2. The semiconductor device of claim 1, wherein the second interconnect structure includes an integrated passive device.

3. The semiconductor device of claim 1, wherein a back surface of the semiconductor die opposite an active surface of the semiconductor die is coplanar with a surface of the conductive pillars opposite the stress relief insulating layer.

4. The semiconductor device of claim 1, further including a plurality of the semiconductor devices stacked and electrically connected through the conductive pillars.

5. The semiconductor device of claim 1, wherein the first interconnect structure is electrically connected to the second interconnect structure through the conductive pillars.

6. The semiconductor device of claim 1, further including a plurality of conductive bumps formed over the first interconnect structure.

7. The semiconductor device of claim 1, wherein:
   the first thickness of the stress relief insulating layer includes a range of 5-100 µm; and
   the second thickness of the stress relief insulating layer includes a range of 2-50 µm.

8. A semiconductor device, comprising:
   a semiconductor die;
   a conductive pillar formed around the semiconductor die;
   a stress relief insulating layer formed over the semiconductor die and the conductive pillar, the stress relief insulating layer including a first thickness over the semiconductor die and a second thickness less than the first thickness over the conductive pillar;
   an encapsulant deposited over the semiconductor die and around the conductive pillar; and
   a first interconnect structure formed over the stress relief insulating layer.

9. The semiconductor device of claim 8, further including a second interconnect structure including an integrated passive device formed over the encapsulant opposite the stress relief insulating layer.

10. The semiconductor device of claim 8, wherein a back surface of the semiconductor die opposite an active surface of the semiconductor die is coplanar with a surface of the conductive pillar opposite the stress relief insulating layer.

11. The semiconductor device of claim 8, further including a plurality of the semiconductor devices stacked and electrically connected through the conductive pillar.

12. The semiconductor device of claim 9, wherein the first interconnect structure is electrically connected to the second interconnect structure through the conductive pillar.

13. The semiconductor device of claim 8, further including a conductive bump formed over the first interconnect structure.

14. The semiconductor device of claim 8, wherein:
   the first thickness of the stress relief insulating layer includes a range of 5-100 µm; and
   the second thickness of the stress relief insulating layer includes a range of 2-50 µm.

15. A semiconductor device, comprising:
   a semiconductor die;
   a conductive pillar formed around the semiconductor die;
   a stress relief insulating layer formed over the semiconductor die and the conductive pillar including an opening in the stress relief insulating layer over the semiconductor die; and
   a first interconnect structure formed over the stress relief insulating layer.

16. The semiconductor device of claim 15, further including:
   an encapsulant deposited over the semiconductor die and around the conductive pillar;
   a second interconnect structure formed over the encapsulant opposite the stress relief insulating layer; and
   an integrated passive device formed over the second interconnect structure.

17. The semiconductor device of claim 15, wherein a back surface of the semiconductor die opposite an active surface of the semiconductor die is coplanar with a surface of the conductive pillar opposite the stress relief insulating layer.

18. The semiconductor device of claim 15, further including a plurality of the semiconductor devices stacked and electrically connected through the conductive pillar.

19. The semiconductor device of claim 15, further including a second interconnect structure formed over the semiconductor die opposite the stress relief insulating layer and electrically connected to the first interconnect structure through the conductive pillar.

20. The semiconductor device of claim 15, wherein the stress relief insulating layer includes a first thickness over the semiconductor die and a second thickness less than the first thickness over the conductive pillar.

21. A semiconductor device, comprising:
   a semiconductor die;
   a conductive pillar formed around the semiconductor die; and
   a stress relief insulating layer formed over the semiconductor die and the conductive pillar including an opening in the stress relief insulating layer over the semiconductor die.

22. The semiconductor device of claim 21, further including:
   an encapsulant deposited over the semiconductor die and around the conductive pillar;
   a first interconnect structure formed over the stress relief insulating layer;
   a second interconnect structure formed over the encapsulant opposite the stress relief insulating layer; and
   an integrated passive device formed over the second interconnect structure.

23. The semiconductor device of claim 21, wherein a back surface of the semiconductor die opposite an active surface of the semiconductor die is coplanar with a surface of the conductive pillar opposite the stress relief insulating layer.

24. The semiconductor device of claim 21, further including a plurality of the semiconductor devices stacked and electrically connected through the conductive pillar.

25. The semiconductor device of claim 21, wherein the stress relief insulating layer includes a first thickness over the semiconductor die and a second thickness less than the first thickness over the conductive pillar.

* * * * *